US012677617B2

(12) United States Patent
Nielsen et al.

(10) Patent No.: US 12,677,617 B2
(45) Date of Patent: Jul. 7, 2026

(54) CYCLIC ETCH-ASH PROCESS FOR SEMICONDUCTOR PROCESSING

(71) Applicant: TEXAS INSTRUMENTS INCORPORATED, Dallas, TX (US)

(72) Inventors: Gordon Nielsen, Cedar Hills, UT (US); Gregory McKee, Riverton, UT (US); Aravindsekar Pandiasekar, Draper, UT (US); Michael O'Toole, Salt Lake City, UT (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 529 days.

(21) Appl. No.: 18/108,914

(22) Filed: Feb. 13, 2023

(65) Prior Publication Data

US 2024/0274432 A1     Aug. 15, 2024

(51) Int. Cl.
| | |
|---|---|
| *H10P 50/28* | (2026.01) |
| *H10P 14/60* | (2026.01) |
| *H10P 14/61* | (2026.01) |
| *H10P 50/00* | (2026.01) |
| *H10P 50/24* | (2026.01) |

(Continued)

(52) U.S. Cl.
CPC ............ *H10P 50/287* (2026.01); *H10P 14/61* (2026.01); *H10P 50/242* (2026.01); *H10P 50/283* (2026.01); *H10P 50/73* (2026.01); *H10W 20/084* (2026.01); *H10P 14/60* (2026.01); *H10P 14/6336* (2026.01); *H10P 95/00* (2026.01); *H10P 95/062* (2026.01); *H10W 20/092* (2026.01)

(58) Field of Classification Search
CPC ........... H01L 21/31138; H01L 21/3065; H01L 21/31116; H01L 21/31144; H01L 21/32; H01L 21/02107; H01L 21/02274; H01L 21/31053; H01L 21/321; H10P 50/287; H10P 50/242; H10P 50/283; H10P 50/73; H10P 14/61; H10W 20/084
See application file for complete search history.

(56) References Cited

U.S. PATENT DOCUMENTS

| | | | |
|---|---|---|---|
| 6,511,916 B1 * | 1/2003 | Wu | .......................... G03F 7/427 257/E21.256 |
| 7,192,531 B1 * | 3/2007 | Kang | ............... H01L 21/76808 438/738 |
| 7,906,032 B2 | 3/2011 | Yamashita | |

(Continued)

*Primary Examiner* — Ratisha Mehta
*Assistant Examiner* — Brad A Knudson
(74) *Attorney, Agent, or Firm* — Andrew R. Ralston; Frank D. Cimino

(57) ABSTRACT

The present disclosure generally relates to removing a photoresist in semiconductor processing, and more particularly, to a cyclic etch-ash process for removing a photoresist that may be integrated into an etch process and/or etch processing tool. In an example, while a semiconductor substrate is disposed within a chamber of a semiconductor processing tool, a first opening is etched through a first dielectric layer while a photoresist is disposed over the first dielectric layer. The first dielectric layer is disposed over a second dielectric layer, and the second dielectric layer is disposed over the semiconductor substrate. After etching the first opening and while the semiconductor substrate is within the chamber, the photoresist is removed including performing a cyclic etch-ash process.

20 Claims, 9 Drawing Sheets

(51) Int. Cl.
   *H10W 20/00*   (2026.01)
   *H10P 95/00*   (2026.01)

(56)         References Cited

U.S. PATENT DOCUMENTS

| | | | |
|---|---|---|---|
| 2005/0106888 A1* | 5/2005 | Chiu | H01L 21/02063 |
| | | | 257/E21.252 |
| 2006/0141799 A1* | 6/2006 | Jo | G03F 7/427 |
| | | | 257/E21.256 |
| 2017/0178955 A1* | 6/2017 | Jiang | H01L 21/3105 |

* cited by examiner

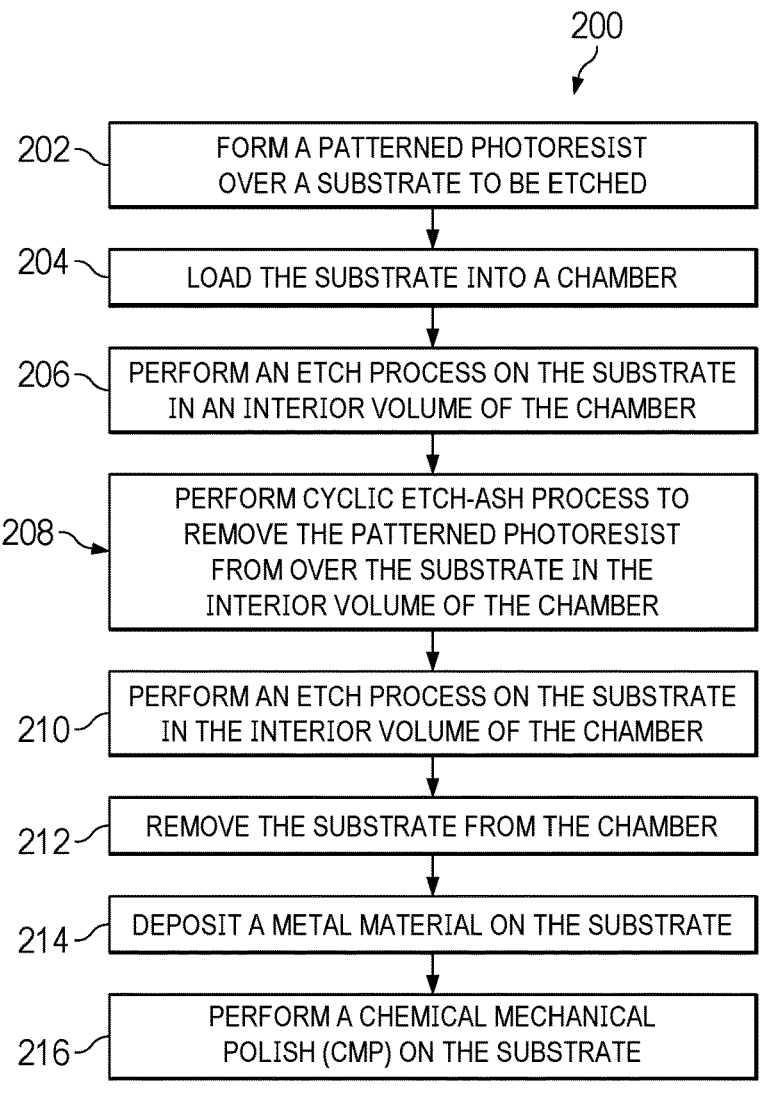

200

202 — FORM A PATTERNED PHOTORESIST OVER A SUBSTRATE TO BE ETCHED

204 — LOAD THE SUBSTRATE INTO A CHAMBER

206 — PERFORM AN ETCH PROCESS ON THE SUBSTRATE IN AN INTERIOR VOLUME OF THE CHAMBER

208 — PERFORM CYCLIC ETCH-ASH PROCESS TO REMOVE THE PATTERNED PHOTORESIST FROM OVER THE SUBSTRATE IN THE INTERIOR VOLUME OF THE CHAMBER

210 — PERFORM AN ETCH PROCESS ON THE SUBSTRATE IN THE INTERIOR VOLUME OF THE CHAMBER

212 — REMOVE THE SUBSTRATE FROM THE CHAMBER

214 — DEPOSIT A METAL MATERIAL ON THE SUBSTRATE

216 — PERFORM A CHEMICAL MECHANICAL POLISH (CMP) ON THE SUBSTRATE

302 — FLOW A FLUORINE-CONTAINING GAS INTO THE INTERIOR VOLUME OF THE CHAMBER

304 — FLOW OXYGEN GAS INTO THE INTERIOR VOLUME OF THE CHAMBER

FIG. 3

CYCLIC ETCH-ASH PROCESS FOR SEMICONDUCTOR PROCESSING

BACKGROUND

Integrated circuit (IC) dies are typically manufactured using precise semiconductor processing. Semiconductor processing usually includes multiple processing steps, where a subsequent processing step builds on the result of preceding processing steps. If a resulting structure of a processing step is not tightly controlled or within a necessary manufacturing tolerance, subsequent processing may be negatively impacted. Negative impacts may include increased engineering intervention, increased down time, or, possibly, decreased yield in fabricated products.

SUMMARY

This summary is provided to introduce a brief selection of disclosed concepts in a simplified form that are further described below in the detailed description including the drawings provided. Various disclosed devices and methods may be beneficially applied in the context of semiconductor processing in which a photoresist may be removed during fabrication of an integrated circuit (IC) die. Some examples described herein may be applied to an integrated etch solution that incorporates a cyclic etch-ash process for removing a photoresist. While such examples may be expected to decrease engineering intervention and/or decrease processing time due to implementation of non-integrated processing, no particular result is a requirement unless explicitly recited in a particular claim.

An example described herein is a method of manufacturing an integrated circuit (IC). While a semiconductor substrate is disposed within a chamber of a semiconductor processing tool, a first opening is etched through a first dielectric layer while a photoresist is disposed over the first dielectric layer. The first dielectric layer is disposed over a second dielectric layer, and the second dielectric layer is disposed over the semiconductor substrate. After etching the first opening and while the semiconductor substrate is within the chamber, the photoresist is removed including performing a cyclic etch-ash process.

Another example described herein is a method of manufacturing an IC. A photoresist layer is formed on a dielectric layer over a semiconductor substrate. An opening is formed in the photoresist layer, thereby exposing the dielectric layer. A portion of the exposed dielectric layer is removed using a plasma etch process. The photoresist layer is removed. The removing includes performing a etch-ash process cycle. The etch-ash process cycle includes: exposing the photoresist layer to a fluorine-based plasma, and then exposing the photoresist layer to an oxygen-based plasma. The etch-ash process cycle is repeated at least once.

A further example described herein is a method of manufacturing an integrated circuit. A dielectric layer is formed over a semiconductor substrate. A photoresist layer is formed over the dielectric layer. The photoresist layer is patterned thereby exposing the dielectric layer through an opening in the photoresist layer. The exposed dielectric layer is etched thereby forming a trench. The photoresist layer is removed by performing at least two etch-ash cycles. Each etch-ash cycle includes: exposing the photoresist layer to a first plasma including a fluorine source species; and then exposing the photoresist layer to a second plasma including oxygen and lacking a fluorine source species. The trench is filled with a copper-containing metal and forming a metal overburden over the dielectric layer. The metal overburden is removed by a chemical-mechanical polishing. A portion of the dielectric layer is removed by the chemical-mechanical polishing.

Another example described herein is a processing tool for semiconductor processing. The processing tool includes a substrate support and a controller. The substrate support is disposed in a process chamber. The substrate support includes a support surface configured to support a semiconductor substrate. The controller includes one or more processors and non-transitory memory including stored instructions, which when executed by the one or more processors, cause the controller to: while the semiconductor substrate is disposed on the support surface, etch a first opening through a first dielectric layer while a photoresist is disposed over the first dielectric layer, wherein the first dielectric layer is disposed over a second dielectric layer, and the second dielectric layer is disposed over the semiconductor substrate; after etching the first opening and while the semiconductor substrate is disposed on the support surface, remove the photoresist comprising performing a cyclic etch-ash process; and after removing the photoresist and while the semiconductor substrate is disposed in the process chamber, etch a second opening through the second dielectric layer.

The foregoing summary outlines rather broadly various features of examples of the present disclosure in order that the following detailed description may be better understood. Additional features and advantages of such examples will be described hereinafter. The described examples may be readily utilized as a basis for modifying or designing other examples that are within the scope of the appended claims.

BRIEF DESCRIPTION OF THE DRAWINGS

So that the manner in which the above recited features may be understood in detail, reference is made to the following detailed description taken in conjunction with the accompanying drawings.

FIG. 2 is a flowchart of a method of manufacturing an integrated circuit (IC) die according to some examples.

FIG. 3 is a flowchart of a cyclic etch-ash process according to some examples.

Figure 1:
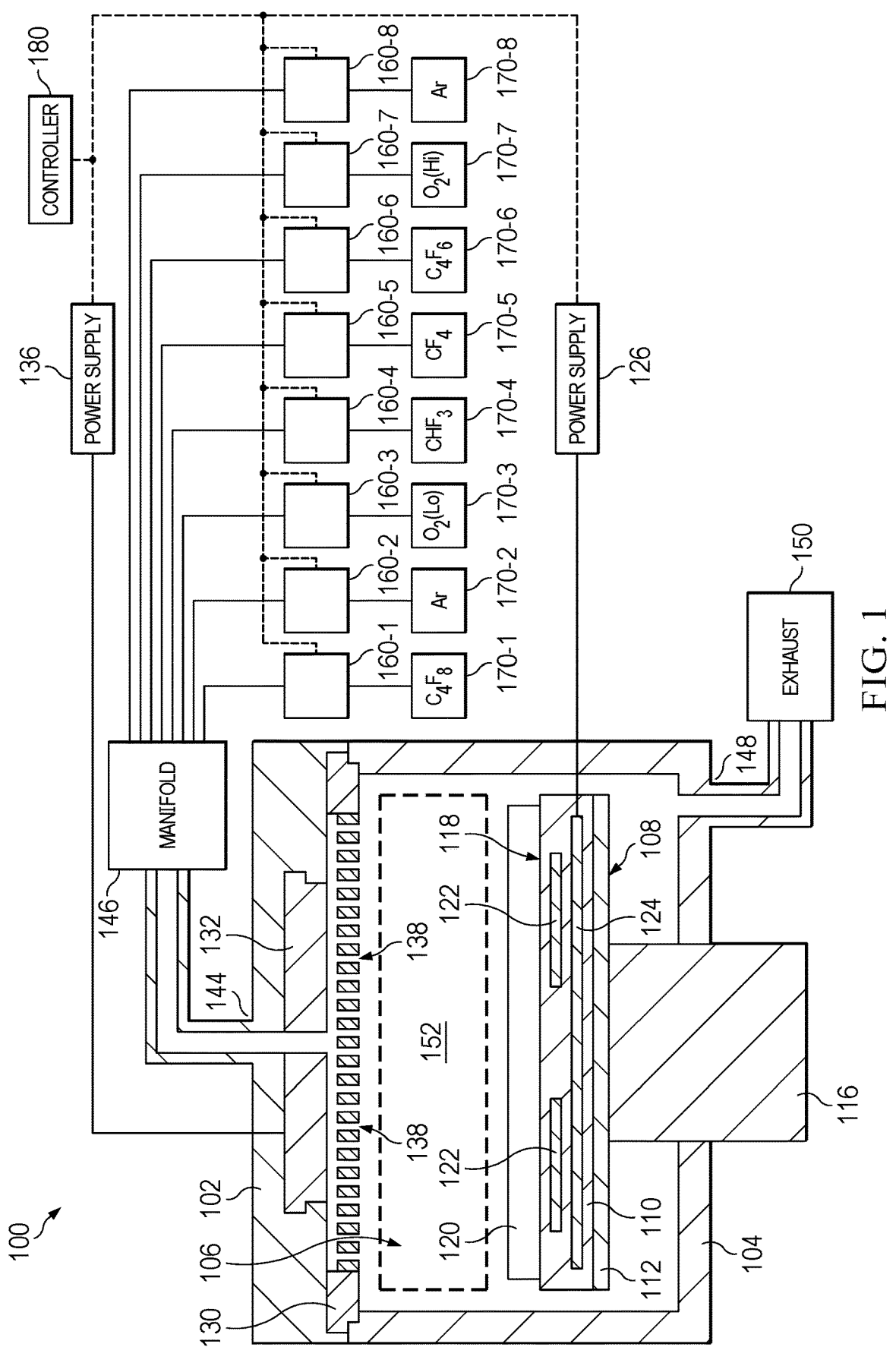
FIG. 1 is a schematic view of a semiconductor processing tool for semiconductor processing according to some examples.

The drawings, and accompanying detailed description, are provided for understanding of features of various examples and do not limit the scope of the appended claims. The examples illustrated in the drawings and described in the accompanying detailed description may be readily utilized as a basis for modifying or designing other examples that are within the scope of the appended claims. Identical reference numerals may be used, where possible, to designate identical elements that are common among drawings. The figures are drawn to clearly illustrate the relevant elements or features and are not necessarily drawn to scale.

DETAILED DESCRIPTION

Various features are described hereinafter with reference to the figures. An illustrated example may not have all the aspects or advantages shown. An aspect or an advantage described in conjunction with a particular example is not necessarily limited to that example and may be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

The present disclosure relates to removing a photoresist in semiconductor processing, and more particularly, to a cyclic etch-ash process for removing a photoresist that may be integrated into an etch process and/or etch processing tool. Such a cyclic etch-ash process may be included in semiconductor processing for manufacturing an integrated circuit (IC) die. In some examples, a cyclic etch-ash process includes multiple cycles, where a cycle includes flowing a fluorine-containing gas into an interior volume of a chamber of a semiconductor processing tool, and then flowing oxygen gas into the interior volume. According to some examples, the etch-ash process is integrated into a semiconductor process in a chamber of a semiconductor processing tool, where the semiconductor process further includes an etch process preceding the etch-ash process and another etch process following the etch-ash process. In such integrated examples, a non-integrated solution for removing a photoresist may be avoided, which may reduce the number of process steps for fabricating an IC die, and/or subsequent manual intervention during a subsequent chemical mechanical polish (CMP) may be avoided. Other benefits or advantages may be achieved by various examples.

FIG. 1 is a schematic view of a semiconductor processing tool 100 for semiconductor processing according to some examples. The semiconductor processing tool 100 in FIG. 1 is illustrated in abbreviated form so as to not obscure various aspects described herein. The semiconductor processing tool 100 is an etch processing tool in some examples. Described examples may be implemented on various commercially-available processing platforms. The semiconductor processing tool 100 is shown as a capacitively coupled plasma (CCP) processing tool in this example. In other examples, the semiconductor processing tool 100 may be configured as an inductively coupled plasma (ICP) processing tool, electron cyclotron resonance (ECR) processing tool, or another processing tool.

The semiconductor processing tool 100 includes a chamber including an upper chamber housing assembly 102 and a lower chamber housing 104. The upper chamber housing assembly 102 engages or mates with the lower chamber housing 104 to form the chamber, which has an interior volume 106. The interior volume 106 is defined by inner walls of the chamber (e.g., the upper chamber housing assembly 102 and lower chamber housing 104).

The semiconductor processing tool 100 includes a substrate support 108 disposed in the interior volume 106 of the chamber. The substrate support 108 includes an electrostatic chuck (ESC) 110 and a cooler 112. In the illustrated configuration, the ESC 110 is disposed over and on the cooler 112. The substrate support 108 is disposed on and is supported by a pedestal 116. The cooler 112 is disposed over and on the pedestal 116. The substrate support 108 has a support surface 118 that is configured to support a semiconductor substrate 120 during a semiconductor process. During a semiconductor process, a semiconductor substrate 120 is disposed on the support surface 118 of the substrate support 108.

The ESC 110 includes chucking electrodes 122 and a lower processing electrode 124 disposed in and/or coated by a dielectric material. The chucking electrodes 122 are electrically coupled to a power supply (e.g., a direct current (DC) power supply (not illustrated)) and are configured to chuck the semiconductor substrate 120 to the substrate support 108, such as by electrostatic force. The lower processing electrode 124 is electrically coupled to a power supply 126 and is configured as a capacitive plate for generating a plasma. The power supply 126 is electrically coupled to the lower processing electrode 124 to supply power to the lower processing electrode 124 for generating a plasma. The power supply 126 may be configured to generate and supply an alternating current (AC) power to the lower processing electrode 124, such as at a radio frequency (e.g., a frequency of 13.56 MHz or 60 MHz) or another frequency. The power supply 126 may supply AC power with any voltage or ampere signal waveform, such as a triangle waveform, square waveform, sine waveform, pulse waveform, or the like. The power supply 126 may include other components that are not illustrated, such as an impedance matching network.

The cooler 112 may include fluid channels disposed in and/or coated by dielectric material. The fluid channels may be configured to have a fluid (e.g., a liquid or gas) flowing therethrough to remove and dissipate thermal energy from the semiconductor substrate 120.

The upper chamber housing assembly 102 includes a gas distribution plate 130 (or showerhead) and an upper processing electrode 132. When the upper chamber housing assembly 102 engages the lower chamber housing 104, the gas distribution plate 130 and upper processing electrode 132 are disposed over the substrate support 108 and support surface 118, and further, the gas distribution plate 130 is disposed between the substrate support 108 and the upper processing electrode 132.

The upper processing electrode 132 is electrically coupled to a power supply 136 and is configured as a capacitive plate for generating a plasma. The power supply 136 is electrically coupled to the upper processing electrode 132 to supply power to the upper processing electrode 132 for generating a plasma. The power supply 136 may be configured to generate and supply an AC power to the upper processing electrode 132, such as at a radio frequency (e.g., a frequency of 13.56 MHz or 60 MHz) or another frequency. The power supply 136 may supply AC power with any voltage or ampere signal waveform, such as a triangle waveform, square waveform, sine waveform, pulse waveform, or the like. The power supply 136 may include other components that are not illustrated, such as an impedance matching network and/or frequency matching circuitry.

The gas distribution plate 130 has openings 138 therethrough. The chamber (e.g., the upper chamber housing assembly 102) has a gas inlet 144 fluidly coupled to a gas manifold 146, and the chamber (e.g., the lower chamber housing 104) has a gas outlet 148 fluidly coupled to an exhaust system 150. The gas inlet 144 is through the upper processing electrode 132. The gas distribution plate 130 is positioned in the upper chamber housing assembly 102 relative to the substrate support 108 such that, during a semiconductor process, a gas flows from the gas manifold 146, through the gas inlet 144 (e.g., through the upper processing electrode 132), and through the openings 138 through the gas distribution plate 130 to a processing volume 152 in the interior volume 106. The processing volume 152 is disposed between the gas distribution plate 130 and the substrate support 108 and is generally where a plasma is generated (using the gas flowed into the processing volume 152) during a semiconductor process. A semiconductor substrate 120 disposed on the support surface 118 of the substrate support 108 is exposed to plasma in the processing volume 152 during the semiconductor process. The gas can then flow through the gas outlet 148 to the exhaust system 150 to be exhausted out of the interior volume 106 of the chamber.

The gas manifold 146 is fluidly coupled separately to mass flow controllers 160-1, 160-2, 160-3, 160-4, 160-5, 160-6, 160-6, 160-7, 160-8 (individually or collectively, mass flow controller(s) 160), and the mass flow controllers 160-1, 160-2, 160-3, 160-4, 160-5, 160-6, 160-6, 160-7, 160-8 are fluidly coupled to gas sources 170-1, 170-2, 170-3, 170-4, 170-5, 170-6, 170-7, 170-8 (individually or collectively, gas source(s) 170), respectively, which may be cylinders, for example. The mass flow controllers 160 each are configured to selectively open and close. When in an opened position a given mass flow controller 160 allows gas from the respective gas source 170 to flow through the given mass flow controller 160 to the gas manifold 146. When in a closed position the given mass flow controller 160 prevents gas from the respective gas source 170 from flowing therethrough. The gas manifold 146 may pass a gas flowing from a mass flow controller 160 to the chamber and/or may mix and pass gases flowing from multiple mass flow controllers 160 to the chamber. As illustrated, in some examples, the gas source 170-1 provides octafluorocyclobutane ($C_4F_8$); the gas source 170-2 provides argon (Ar) at a high flow rate; the gas source 170-3 provides oxygen ($O_2$) at a first lower flow rate; the gas source 170-4 provides trifluoromethane ($CHF_3$); the gas source 170-5 provides carbon tetrafluoride ($CF_4$); the gas source 170-6 contains hexafluorobutadiene ($C_4F_6$); the gas source 170-7 provides oxygen ($O_2$) gas at a second higher flow rate; and the gas source 170-8 provides argon (Ar) at a low flow rate. Other gases may be implemented in other examples. In some examples, the gas sources 170 may contain a highly pressurized liquid form that vaporizes into gaseous form upon pressure being reduced.

Although not shown, the semiconductor processing tool 100 may include a door or slit valve through which a semiconductor substrate 120 is transferred between semiconductor processes. A semiconductor substrate 120 may be transferred through the door or slit valve (e.g., by a robot arm) and onto the support surface 118 to load the semiconductor substrate 120 prior to semiconductor processing of that semiconductor substrate 120. Similarly, the semiconductor substrate 120 may be transferred from the support surface 118 and through the door or slit valve (e.g., by a robot arm) to remove the semiconductor substrate 120 after semiconductor processing of the semiconductor substrate 120. A load lock or transfer chamber may engage the semiconductor processing tool 100 at the door or slit valve such that the interior volume 106 of the chamber of the semiconductor processing tool 100 may be maintained at low or reduced pressure (e.g., maintained at vacuum) during transfer of the semiconductor substrate 120.

The semiconductor processing tool 100 includes a controller 180. The controller 180 may be or include any processor-based system, which may be or include a hardened processor architecture, a soft processor (e.g., implemented on programmable fabric of a field programmable gate array (FPGA)), or a combination thereof. For example, the controller 180 may be or include a computer, a server, a programmable logic controller (PLC), the like, or a combination thereof. The controller 180 may control operation of the semiconductor processing tool 100 and may be programmed to implement operations of the semiconductor processing tool 100 as described herein. Among other things, the controller 180 is communicatively coupled to the power supplies 126, 136 and mass flow controllers 160 for controlling the operation of those components.

FIG. 2 is a flowchart of a method 200 of manufacturing an IC die according to some examples. FIG. 3 is a method of performing a cyclic etch-ash process, as performed in the method 200 of FIG. 2, according to some examples. FIGS. 4, 5, 6, 7, 8, and 9 are respective cross-sections of a portion of an IC die 400 during fabrication according to some examples. The method 200 of FIG. 2 is described herein in the context of FIGS. 4 through 9, although the method 200 may be implemented to manufacture other IC dies. Further, the method 200 of FIG. 2 is described herein in the context of the semiconductor processing tool 100 of FIG. 1, although the method 200 may be implemented using other semiconductor processing tools.

Figure 4:
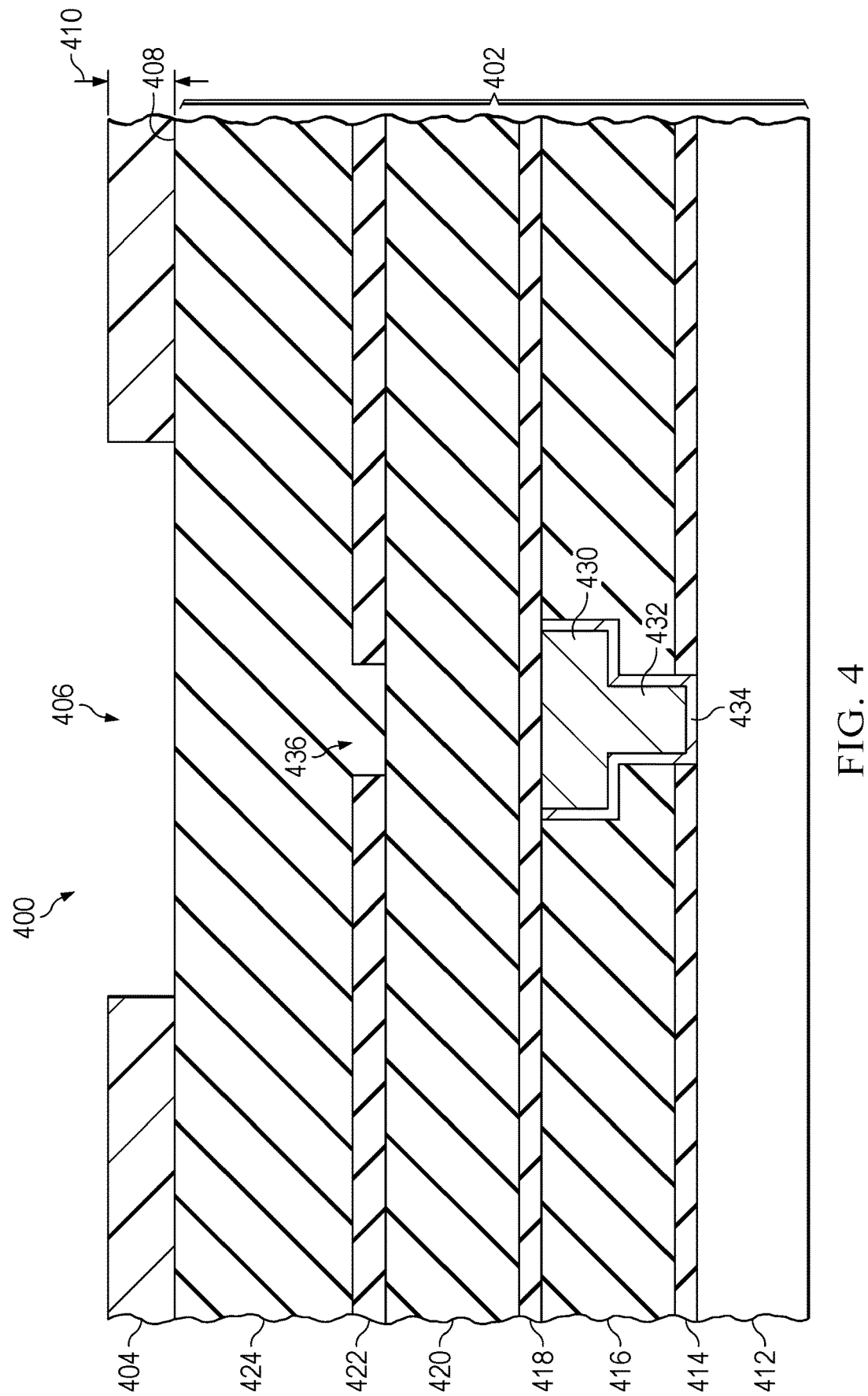
FIGS. 4, 5, 6, 7, 8, and 9 are respective cross-sections of a portion of an IC die during fabrication according to some examples.

Referring to FIG. 2, at block 202, a patterned photoresist is formed over a substrate to be etched, e.g. including a semiconductor production wafer at an intermediate stage of manufacturing. FIG. 4 illustrates a substrate 402 to be etched with a patterned photoresist 404 disposed over the substrate 402 according to an example. The patterned photoresist 404 has an opening 406 therethrough that exposes the substrate 402 where the substrate 402 is to be etched. The patterned photoresist 404 may be formed by depositing a photoresist on the substrate 402 (e.g., by spin on), exposing the photoresist to a pattern of light (e.g., ultraviolet (UV) light), and developing the photoresist. The opening 406 exposes a top surface 408 of the substrate 402. As formed and prior to a subsequent etch process, the patterned photoresist 404 has a thickness 410 in a direction normal to the top surface 408 of the substrate 402. The thickness 410 may be greater than 1.2 μm, such as in a range from 1.2 μm to 2.5 μm.

The substrate 402 includes a semiconductor substrate 412, a first etch stop layer (ESL) 414, a first inter-metal dielectric (IMD) layer 416, a second ESL 418, a second IMD layer 420, a third ESL 422, and a third IMD layer 424. The first ESL 414 is disposed over the semiconductor substrate 412. In some examples, one or more other layers, such as pre-metal dielectric layers (PMDs), ESL(s), inter layer dielectric (ILD) layer, and/or IMD layer(s), may be disposed between the semiconductor substrate 412 and the first ESL 414. The first IMD layer 416 is disposed on or over the first ESL 414. The second ESL 418 is disposed on or over the first IMD layer 416. The second IMD layer 420 is disposed on or over the second ESL 418. The third ESL 422 is disposed on or over the second IMD layer 420. The third IMD layer 424 is disposed on or over the third ESL 422. Further, a metal line 430 is disposed in (e.g., embedded in) the first IMD layer 416, and a metal via 432 extends from the metal line 430 through the first IMD layer 416 and first ESL 414. A barrier layer 434 is disposed conformally along surfaces of the metal line 430 and metal via 432, and between (i) the metal line 430 and metal via 432 and (ii) the first IMD layer 416 and first ESL 414. The barrier layer 434 may form a respective part of the metal line 430 and the metal via 432. The metal via 432 may electrically contact another feature, such as a metal line, underlying metal via 432. A via opening 436 is disposed through the third ESL 422, and a portion of the third IMD layer 424 is disposed in the via opening 436 and contacting the second IMD layer 420. The top surface of the third IMD layer 424 is the top surface 408 a portion of which is exposed by the opening 406 through the patterned photoresist 404.

The semiconductor substrate 412 may be or include any semiconductor material and may include a bulk material (e.g., bulk silicon) and/or one or more epitaxial layers of a semiconductor material. One or more semiconductor devices (e.g., transistors) may be formed in, on, and/or over the semiconductor substrate 412. In some examples, the first ESL 414, second ESL 418, and third ESL 422 may be or include silicon nitride, silicon oxynitride, the like, or a combination thereof. The first ESL 414, second ESL 418, and third ESL 422 may, in some instances, each be a different material than, e.g., an adjoining IMD layer (e.g., overlying and/or underlying). The first ESL 414, second ESL 418, and third ESL 422 permit etch selectivity between an adjoining IMD layer and the respective ESL. In some etch processes, a given ESL may be etched at a different rate than the adjoining IMD layer depending on the etch process. The first ESL 414, second ESL 418, and third ESL 422 may each be deposited by an appropriate deposition process, such as a chemical vapor deposition (CVD) (e.g., plasma enhanced CVD (PECVD)) or the like. The first IMD layer 416, second IMD layer 420, and third IMD layer 424 may each be or include a silicon oxide or other dielectric material. Example materials for the IMD layers may include a tetraethyl orthosilicate (TEOS) silicon oxide, phosphosilicate glass (PSG), the like, or a combination thereof. The first IMD layer 416, second IMD layer 420, and third IMD layer 424 may each be deposited by an appropriate deposition process, such as CVD or the like.

The metal line 430 and metal via 432 may each be or include a metal such as copper (Cu), aluminum (Al), tungsten (W), a combination thereof, or the like. The barrier layer 434 may be or include titanium (Ti), titanium nitride (TiN), tantalum nitride (TaN), the like, or a combination thereof. A trench (for the metal line 430) and via opening (for the metal via 432) may be formed in the first IMD layer 416 using appropriate photolithography and etching processes, such as in a damascene process. The barrier layer 434 may then be conformally deposited in the trench and via opening using an appropriate conformal deposition process, such as PECVD, atomic layer deposition (ALD), or the like. The metal line 430 and metal via 432 may then be deposited on or over the barrier layer 434 in the trench and via opening by an appropriate deposition process, such as CVD, physical vapor deposition (PVD), or the like. Any excess material of the metal line 430 and barrier layer 434 may be removed from a top surface of the first IMD layer 416 by a chemical mechanical polish (CMP). The opening 436 through the third ESL 422 may be formed using appropriate photolithography and etching processes.

Although various layers and structures of FIG. 4 have been described collectively for brevity, the order of manufacturing the IC die 400 of FIG. 4 is understood in view of the illustration of FIG. 4. Other structures may be implemented in other examples, and FIG. 4 is provided for context of understanding some examples.

Referring back to FIG. 2, at block 204, the substrate is loaded in a processing chamber of a processing tool. For example, the substrate 402, with the patterned photoresist 404 thereover, may be loaded into the interior volume 106 of the chamber of the semiconductor processing tool 100 and onto the support surface 118. The substrate 402 may be loaded in the interior volume 106 using, e.g., a transfer chamber or load lock exterior to and engaging the chamber (e.g., the lower chamber housing 104) such that the interior volume 106 (and the substrate 402) is not exposed to an atmospheric, ambient environment during the transfer.

Figure 5:
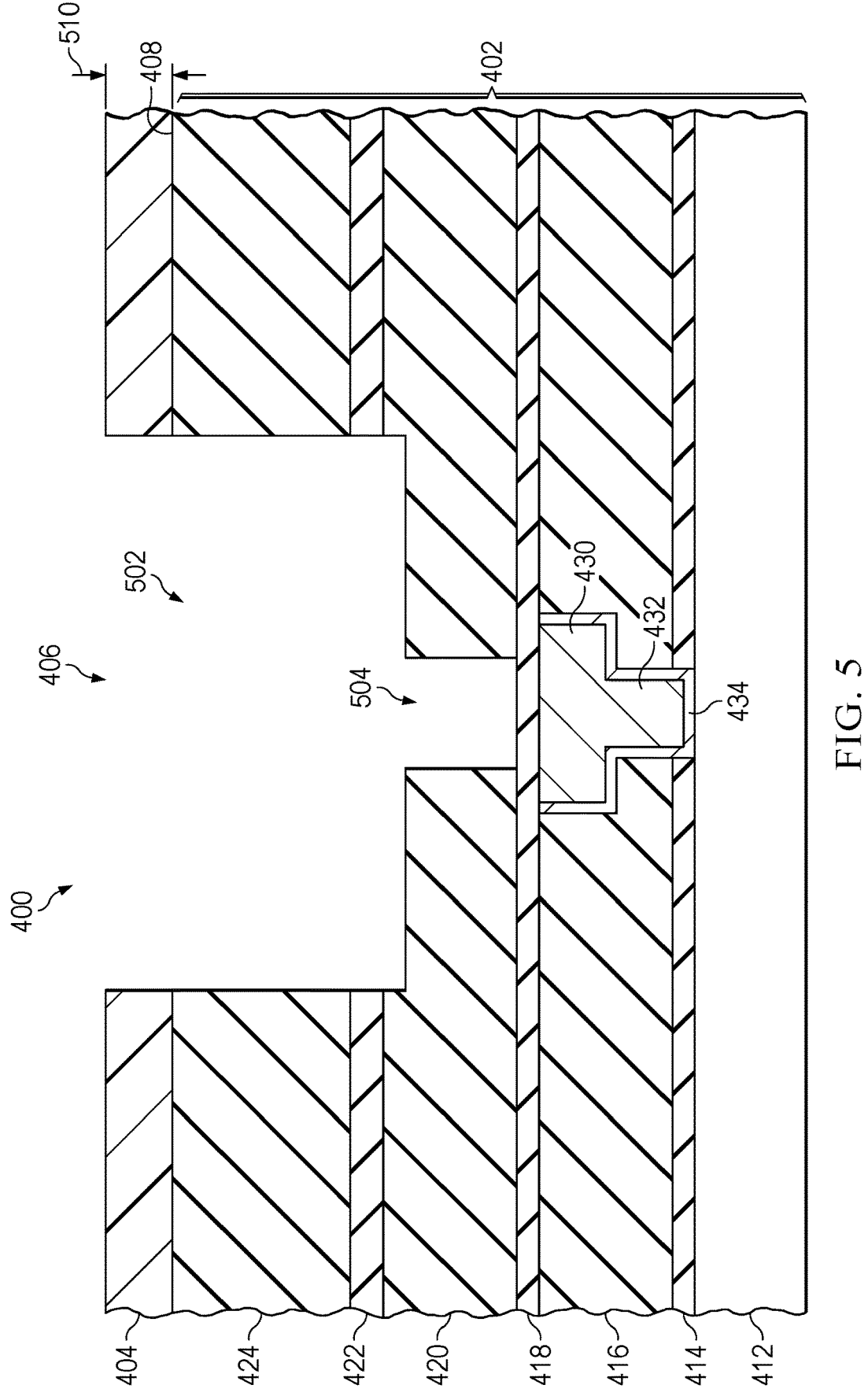

At block 206, an etch process is performed on the substrate in the interior volume of the chamber. Referring to FIG. 5, the etch process forms a trench 502, which corresponds to the opening 406, in the third IMD layer 424 and forms a via opening 504 in the second IMD layer 420 corresponding to the via opening 436 (FIG. 4). In the illustrated example, the etch process generally etches the third IMD layer 424 and second IMD layer 420 at a greater rate than the third ESL 422. Hence, when the etch process becomes incident on the third ESL 422, etching on the third ESL 422 is slower than etching through the via opening 436 through the third ESL 422, which generally forms the via opening 504. The etch process may form the trench 502 to the third ESL 422, through the third ESL 422, or into the second IMD layer 420 in various examples. In examples in which the third IMD layer 424 and the second IMD layer 420 are TEOS silicon oxide and the third ESL 422 is silicon oxynitride, the etch process may include a first stage of flowing gases into the interior volume 106 of the chamber and a second stage of flowing gases into the interior volume 106 of the chamber following the first stage. The first stage may include flowing a gas mixture including trifluoromethane ($CHF_3$), carbon tetrafluoride ($CF_4$), oxygen ($O_2$), and a non-reactive (e.g., carrier) gas (e.g., argon (Ar)). The second stage may include flowing a gas mixture including octafluorocyclobutane ($C_4F_8$), hexafluorobutadiene ($C_4F_6$), oxygen ($O_2$), and a non-reactive (e.g., carrier) gas (e.g., argon (Ar)). Other gases may be implemented that provide similar chemical effects.

The etch process may remove, for example, less than 0.8 μm of the thickness 410 of the patterned photoresist 404. Hence, depending on the thickness 410 of the photoresist 404 as formed, the patterned photoresist 404, following the etch process of block 206, may have a thickness 510 in a direction normal to the top surface 408 of the substrate 402 that is greater than 0.5 μm, such as in a range from 0.5 μm to 1.7 μm.

Figure 6:
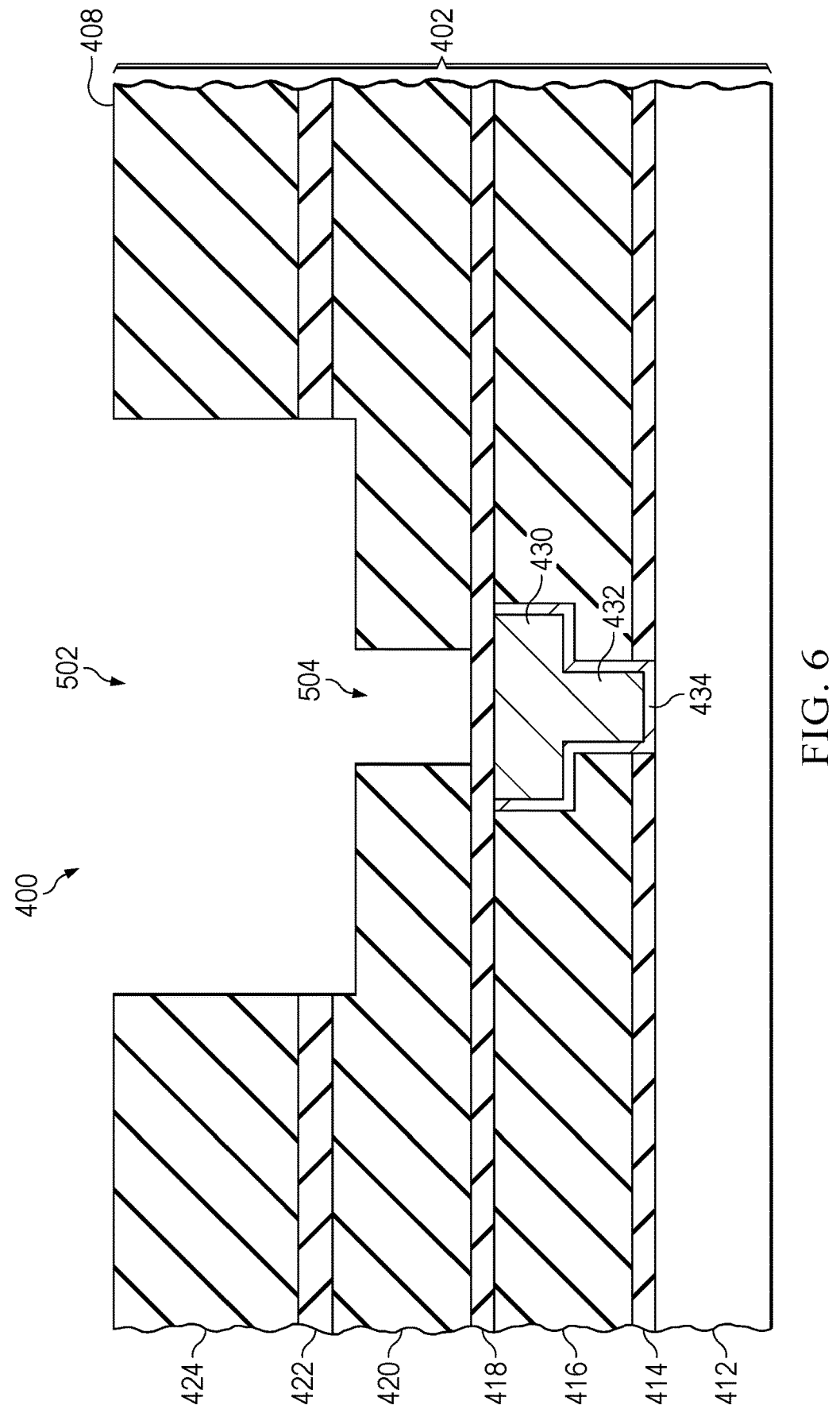

Referring back to FIG. 2, at block 208, a cyclic etch-ash process is performed to remove the patterned photoresist from over the substrate in the interior volume of the chamber. Referring to FIG. 6, the patterned photoresist 404 is removed from over the substrate 402 using the cyclic etch-ash process.

FIG. 3 is a flowchart of the cyclic etch-ash process of block 208 implemented in some examples. The cyclic etch-ash process includes, in a cycle, flowing a fluorine-containing gas into the interior volume 106 of the processing chamber at block 302 and flowing oxygen ($O_2$) gas into the interior volume of the chamber at block 304. Performance of block 302 and block 304 is a cycle, and blocks 302, 304 may be performed in any order in a cycle. The cyclic etch-ash process may include any number of two or more cycles. In some examples, the cyclic etch-ash process includes three cycles.

Block 302 may remove byproducts of the preceding etch process formed on the patterned photoresist in the block 206 with little removal of the patterned photoresist 404. In other words, the etch process implemented in the block 302 is highly selective to the photoresist 404. Hence, block 302 may be referred to as an "etch block". The fluorine chemistry provided by flowing the fluorine-containing gas may remove oxidized byproducts that may be redeposited on the patterned photoresist during the preceding etch process. In some examples, the fluorine-containing gas may include a fluorine-containing species, such as carbon tetrafluoride ($CF_4$), nitrogen trifluoride ($NF_3$), sulfur hexafluoride ($SF_6$), the like, or a combination thereof. Further, the fluorine-containing gas may be or include a mixture comprising the fluorine-containing species and another gas, such as oxygen (O$_2$). In some examples, the fluorine-containing gas is a mixture comprising oxygen (O$_2$) gas and a fluorine-containing species of carbon tetrafluoride (CF$_4$). In such examples, the flow rate of the carbon tetrafluoride (CF$_4$) may be in a range from 1 sccm to 200 sccm, and the flow rate of the oxygen (O$_2$) may be in a range from 10 sccm to 1,000 sccm.

In some examples, the fluorine-containing gas flowed into the interior volume 106 at block 302 is flowed into a plasma generated in the processing volume 152 in the interior volume. In the context of the semiconductor processing tool 100 of FIG. 1, the power supply 126 may provide no power (e.g., 0 W) or power up to 3,000 W to the lower processing electrode 124, and the power supply 136 may provide no interior volume 106 at block 304 (e.g., with the plasma generated) may be for a duration in a range from 20 seconds to 120 seconds.

In some examples, the interior volume of the chamber is maintained at a high pressure, such as greater than 50 mtorr (6.67 Pa), while the oxygen (O$_2$) is flowed into the interior volume at block 302. In some examples, the interior volume of the chamber is maintained at a pressure in a range from 10 mtorr (1.33 Pa) to 200 mtorr (26.66 Pa) while the fluorine-containing gas is flowed into the interior volume at block 302.

Table 1 below shows an example implementation of the cyclic etch-ash process of block 208 detailed in FIG. 3. The example in Table 1 has three cycles, although more or fewer cycles may be implemented.

TABLE 1

| | Cycle 1 Etch Block 302 | Cycle 1 Ash Block 304 | Cycle 2 Etch Block 302 | Cycle 2 Ash Block 304 | Cycle 3 Etch Block 302 | Cycle 3 Ash Block 304 |
|---|---|---|---|---|---|---|
| Pressure (mtorr) | 100 | 100 | 100 | 100 | 100 | 100 |
| Upper Electrode Power (W) | 2,000 | 2,500 | 2,000 | 2,500 | 2,000 | 2,500 |
| Lower Electrode Power (W) | 0 | 600 | 0 | 600 | 0 | 600 |
| O$_2$ (sccm) | 15.0 | 1,000 | 15.0 | 1,000 | 15.0 | 1,000 |
| CF$_4$ (sccm) | 150 | 0 | 150 | 0 | 150 | 0 |
| Duration (sec) | 10 | 40 | 10 | 40 | 10 | 40 | power (e.g., 0 W) or power up to 3,000 W to the upper processing electrode 132. The power provided to the lower processing electrode 124 and upper processing electrode 132 may cause the plasma to be generated in the processing volume 152. The fluorine-containing gas flowed into the interior volume 106 at block 302 (e.g., with the plasma generated) may be for a duration in a range from 5 seconds to 20 seconds.

In some examples, the interior volume 106 of the chamber is maintained at a pressure greater than 50 mtorr (6.67 Pa), while the fluorine-containing gas is flowed into the interior volume at block 302. If the pressure in the interior volume 106 is too low a plasma density may result that is insufficient to adequately remove byproducts. Conversely, if the pressure is too high a non-uniform plasma density may result, which may lead to non-uniform byproduct removal. In some examples, the interior volume of the chamber is maintained at a pressure in a range from 10 mtorr (1.33 Pa) to 200 mtorr (26.66 Pa) while the fluorine-containing gas is flowed into the interior volume at block 302.

Block 304 may remove the patterned photoresist at a greater rate than does the block 302. Hence, block 304 may be referred to as an "ash block". In some examples, the oxygen (O$_2$) may be flowed into the chamber alone in block 304 or with another gas. In some examples, oxygen (O$_2$) is flowed alone into the interior volume at block 304. In such examples, the flow rate of the oxygen (O$_2$) may be in a range from 10 sccm to 1,000 sccm.

In some examples, the oxygen (O$_2$) flowed into the interior volume at block 304 is flowed into a plasma generated in the processing volume 152 in the interior volume. In the context of the semiconductor processing tool 100 of FIG. 1, the power supply 126 may provide no power (e.g., 0 W) or power up to 3,000 W to the lower processing electrode 124, and the power supply 136 may provide no power (e.g., 0 W) or power up to 3,000 W to the upper processing electrode 132. The oxygen (O$_2$) flowed into the The cyclic etch-ash process may be varied in different examples. For example, the process conditions for a process of a given etch block or ash block may vary between different cycles. Further, additional operations may be implemented in some examples. For example, before and/or between the operations of blocks 302, 304, a plasma may be quenched, and in the absence of a plasma, process conditions, such as the flow rates of gases, may be changed and brought to a stable condition before a plasma is ignited for the operation of the subsequent block 302 or block 304. That is, power to the upper processing electrode 132 and the lower processing electrode 124 may be removed between the operations of blocks 302, 304 while other process conditions, such as the flow rates of gasses, are brought to a stable condition.

In the example off Table 1, the ratio of time during the ash block 304 to the time during the etch block 302 is 4. This ratio may also be expressed as a duty cycle of ash time to etch time, e.g. 4:1 or 400%. The duty cycle may generally be related in part to the power applied during the etch block 302 and during the ash block 304. For example, increasing the upper electrode power in the ash block 304 may increase the rate of resist removal, thereby reducing the time the ash block 304 is used, and reducing the duty cycle. Similarly, decreasing the upper electrode power during the etch block 302 may decrease the rate of removing oxidized byproducts from over the patterned photoresist 404, resulting in a greater duration of the etch block 302 and a lower duty cycle.

It may be desirable to limit the upper electrode power below a maximum level that could otherwise have undesirable effects, such as plasma damage to components of the IC die 400. On the other hand, it may be desirable to limit the upper electrode power above a minimum power below which may result an undesirably long process cycle time. In view of such considerations, various examples may provide an upper electrode power in a range from about 0.5 kW to about 3 kW, and an ash/etch duty cycle in a range from about 100% to about 1000%.

Figure 7:
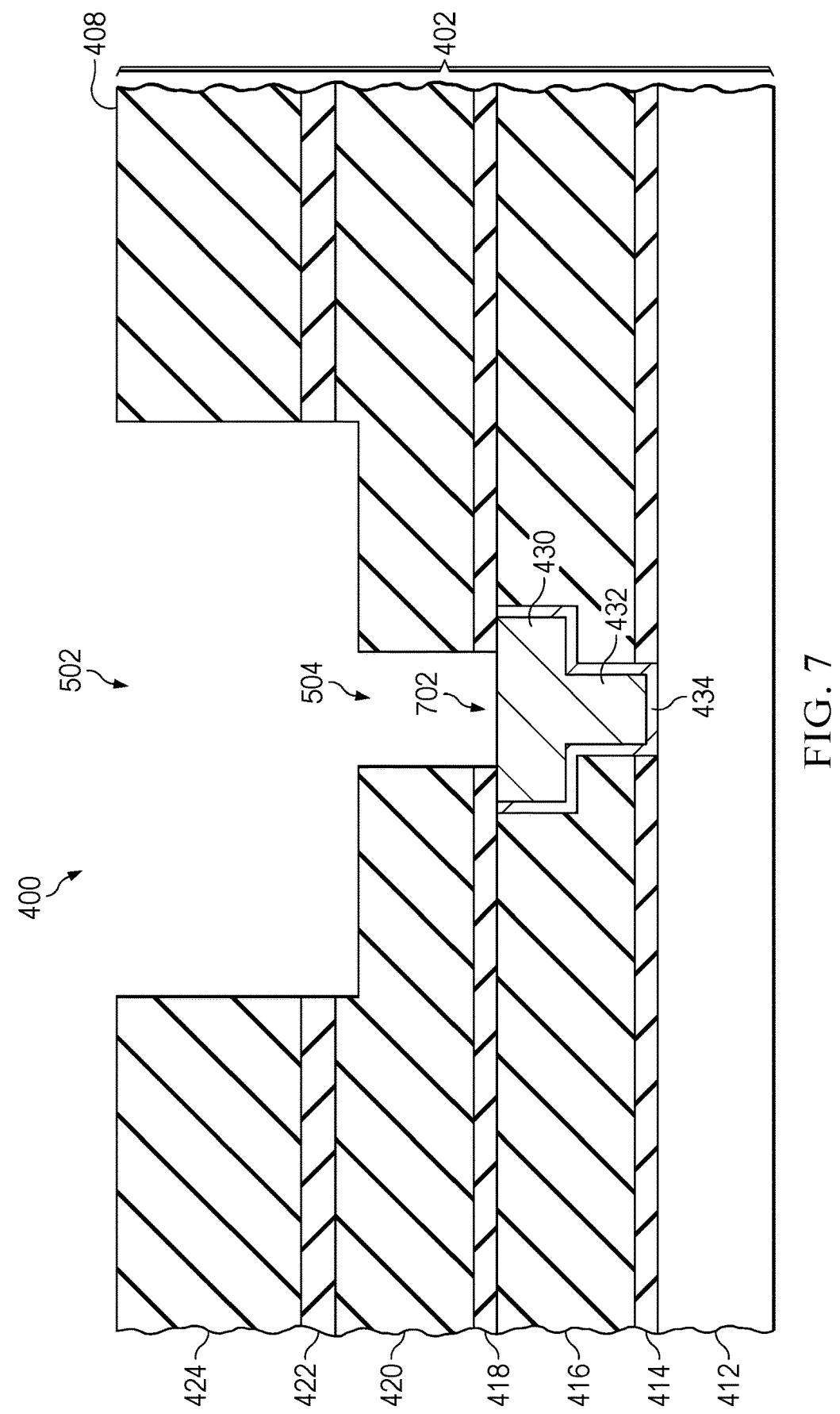

Referring back to FIG. 2, at block 210, an etch process is performed on the substrate in the interior volume of the chamber. Referring to FIG. 7, the etch process forms a via opening 702 through the second ESL 418 to expose the metal line 430. The etch process of block 210 in the context of FIG. 7 selectively etches the second ESL 418 that is exposed by the via opening 504 and extends the via opening 504 with the via opening 702. In examples in which the third IMD layer 424 and the second IMD layer 420 are TEOS silicon oxide and the second ESL 418 is silicon nitride, the etch process may include flowing a gas mixture including trifluoromethane ($CHF_3$), carbon tetrafluoride ($CF_4$), and a non-reactive (e.g., carrier) gas (e.g., argon (Ar)). Other gases may be implemented.

Referring back to FIG. 2, at block 212, the substrate is removed from the interior volume of the chamber. For example, the substrate 402 may be removed from the interior volume 106 using, e.g., a transfer chamber or load lock exterior to and engaging the chamber (e.g., the lower chamber housing 104) such that the interior volume 106 (and the substrate 402) is not exposed to an atmospheric, ambient environment during the transfer.

Figure 8:
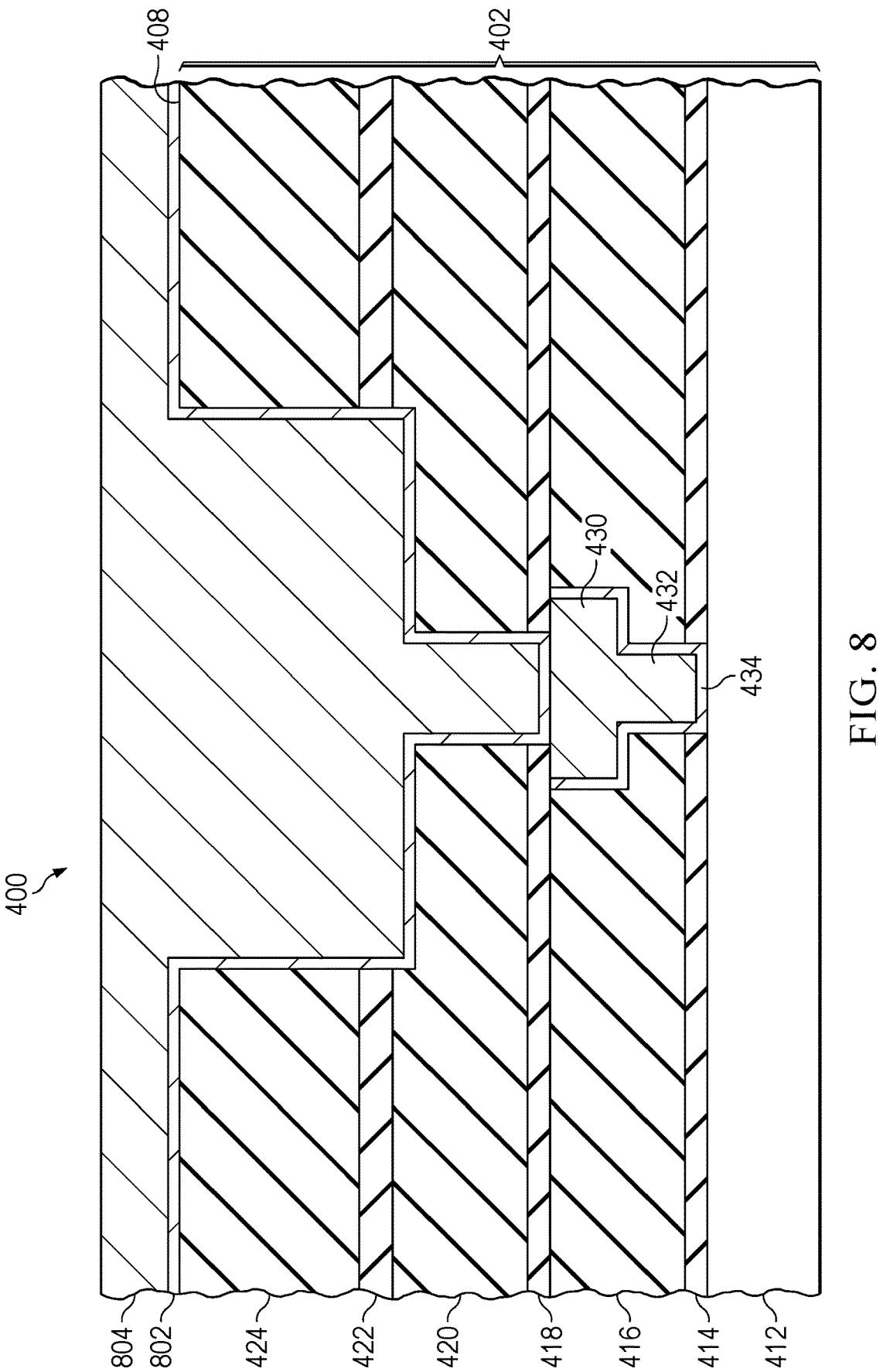

At block 214, a metallic material is deposited on the substrate. Referring to FIG. 8, a metallic material, including a barrier layer 802 and metal 804, is deposited on the substrate 402. The barrier layer 802 is formed conformally on surfaces that define the via openings 702, 504 and trench 502, on or over the exposed surface of the metal line 430, and on or over the top surface 408 of the third IMD layer 424. The barrier layer 802 may be or include titanium (Ti), titanium nitride (TiN), tantalum nitride (TaN), the like, or a combination thereof. The barrier layer 802 may be conformally deposited using an appropriate conformal deposition process, such as PECVD, ALD, or the like. The metal 804 is formed on or over the barrier layer 802 and in the via openings 702, 504 and the trench 502. The metal 804 may be or include copper (Cu), aluminum (Al), tungsten (W), the like, or a combination thereof. The metal 804 may be deposited by an appropriate deposition process, such as CVD, PVD, or the like.

Figure 9:
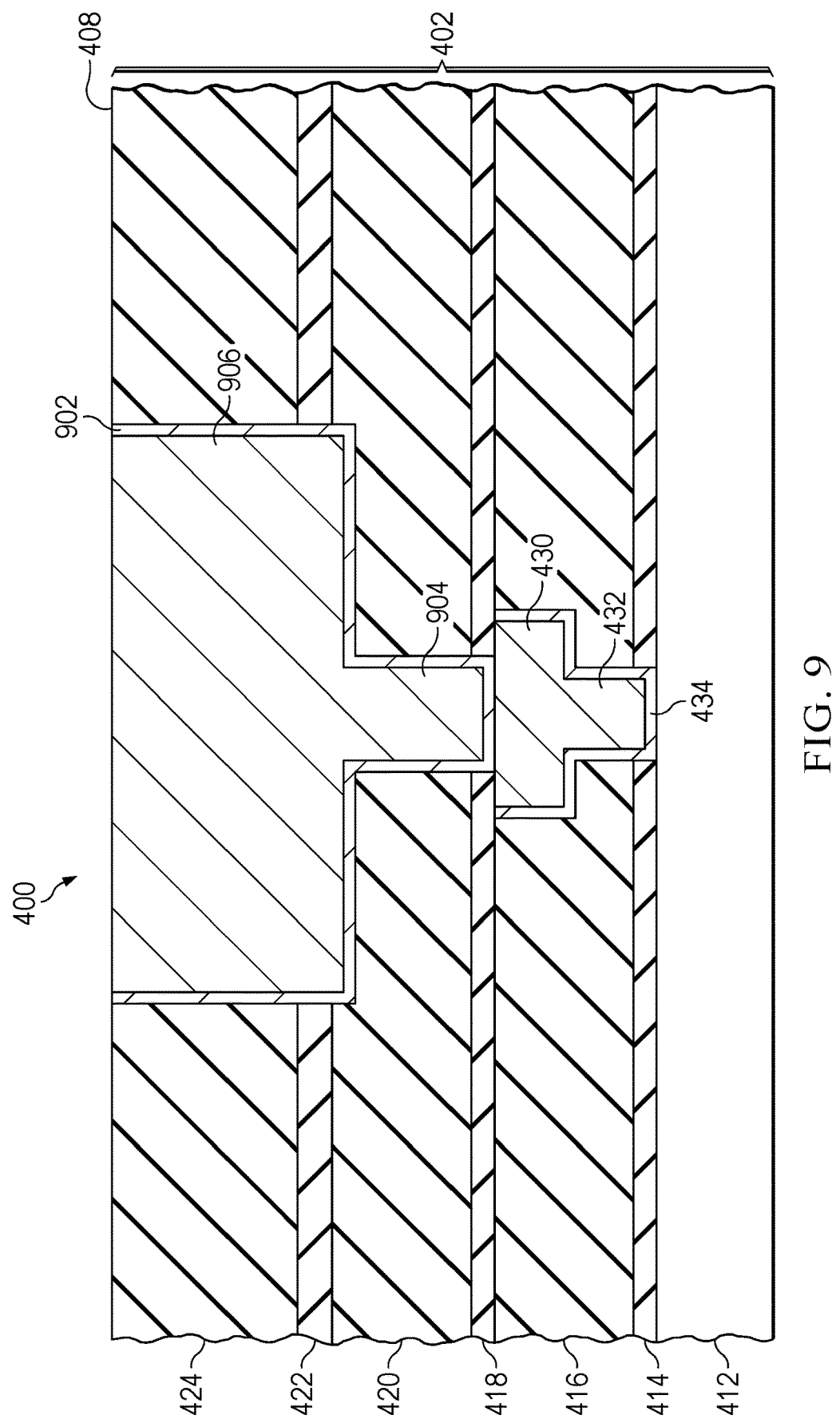

Referring back to FIG. 2, at block 216, a CMP is performed on the substrate. Referring to FIG. 9, the CMP is performed on the substrate 402 to remove excess metal 804 and barrier layer 802 (e.g., overburden) that is over the top surface 408 of the third IMD layer 424. The CMP results in the top surfaces of the third IMD layer 424 and resulting barrier layer 902 and metal line 906 to be co-planar. A metal line 906 with barrier layer 902 is formed in the trench 502, and a metal via 904 with barrier layer 902 is formed extending from the metal line 906 in the via openings 504, 702. The metal via 904 with barrier layer 902 contacts and is electrically connected to the metal line 430 in the first IMD layer 416.

As noted previously, the structure fabricated in FIGS. 4 through 9 is merely an example by which to illustrate the method 200 of FIG. 2. In other examples, different structures may be fabricated according to the method 200 or variations of the method 200 according to other examples. Further, although IMD layers 416, 420, 424 and ESLs 414, 418, 422 have been described as respective IMD layers and ESLs, each of these layers may more generally be referred to as respective dielectric layers. Further, the cyclic etch-ash process described herein can be implemented in other contexts. For example, the cyclic etch-ash process may be applied in the context of removing a photoresist used in any type of etch that leaves behind a resist mask that has become ash resistant due to the nature of the etch. Such etches may include long, aggressive etches that etch deep trenches or openings. These etches typically implement a thick photoresist stack.

It has been observed that, following some trench/via etch processes, after removing the patterned photoresist using only an oxygen-based ash process some residual portions of the underlying dielectric (e.g. the IMD layer 424) extend above a desirable smooth surface. It is thought that the fluorine-containing etch of the dielectric results in a difficult-to-remove residue, or "crust", on some portions of the photoresist, particularly when the trench/via etch is highly selective to the etch stop layer, e.g. the ESL 418. This residue may result in laterally extended roughened higher portions in some areas of a pattern, or localized "cone defects" in some other areas of the pattern due to micromasking. This topography could result in poor endpoint detection during the CMP to remove metal 804 from over the top surface 408 in block 216. For example, poor uniformity of reflection and/or refraction due to the topography could cause a smooth rolling decrease of magnitude of an optical monitor signal, whereas a sharp decrease in magnitude is typically desirable for optical signal endpoint detection.

According to some examples, a cyclic etch-ash process such as described in various examples may remove a photoresist layer in a manner that results in acceptable uniformity of the top surface of the dielectric layer (e.g., top surface 408 of the third IMD layer 424). The fluorine-based etch of block 302 may remove byproducts (e.g., such as oxide byproducts resulting from etching TEOS silicon oxide) and/or ash-resistant photoresist, and the $O_2$ ash of block 304 may remove the photoresist. The cyclic nature of the cyclic etch-ash process may permit removal of byproducts and/or ash-resistant photoresist during the slight etch of block 302 as the byproducts and/or ash-resistant photoresist become exposed, e.g., by removal of the photoresist during the ash of block 304. The reduced number of defects at the top surface 408 may reduce and/or remove the micromasking effect described above, and the top surface 408 of the substrate may remain more planar. The increased planarity of the top surface 408 may permit a sharp decrease in magnitude of an optical signal for endpoint detection during the CMP that removes the metal (e.g., metal 804 and/or barrier layer 802) from over the top surface 408.

In such examples, manual intervention for endpoint determination for the CMP may be avoided, and wear on a CMP pad and time for CMP may be reduced. If a top surface has topography, a functional IC die may still be manufactured as long as the CMP polishes to a depth lower than the topography (e.g., over-polishing), thus removing the topography. This may be achieved using manual intervention to determine the CMP endpoint. Manual intervention may result in increased engineering time and, thus, higher costs. Further, the topography and over-polishing may increase wear on a CMP pad, which may reduce the useful life of the CMP pad. Also, the over-polishing may result in increased times for the CMP. However, with some examples as described above, these adverse effects may be avoided since an end point may be detected without manual intervention due to the increased planarity of the top surface 408.

Additionally, in such examples, an integrated solution may be implemented in an etch processing tool. Some solutions to avoid the topography described above include using a dedicated asher processing tool to remove a photoresist. A dedicated asher processing tool may permit ashing using higher temperatures and higher oxygen gas flow rates than what some etch processing tools permit. The dedicated asher processing tool may be capable of removing the byproducts and/or ash-resistant photoresist with the photoresist due to the greater capabilities of the asher processing tool relative to the etch processing tool. However, using a dedicated asher processing tool can increase manufacturing times due to transfer of a substrate between an etch processing tool and the asher processing tool. Also, using a dedicated asher processing tool may require additional processing, such as an additional solvent cleaning step, which may increase manufacturing times and costs. The dedicated asher processing tool and/or other processing tools for other required processing due to implementing the dedicated asher processing tool may be bottlenecks for manufacturing, which may further increase manufacturing time. Some examples as described above may avoid using a dedicated asher processing tool and corresponding adverse effects by integrating the removal of the photoresist (and achieving reduced topography as described above) in an etch processing tool between etch processes.

Figure 10:
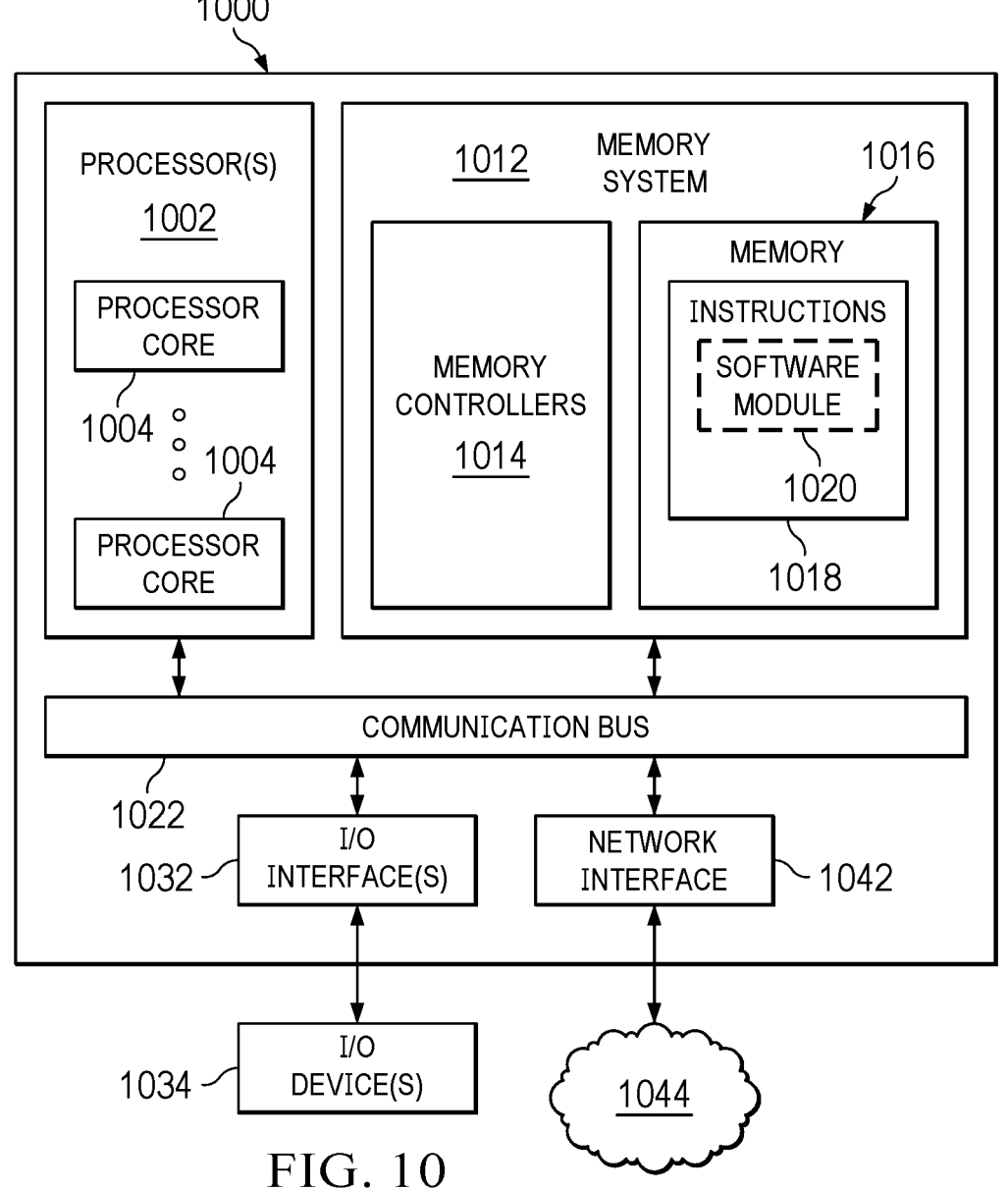
FIG. 10 is a block diagram of a processor-based system according to some examples.

FIG. 10 is a block diagram of a processor-based system 1000 according to some examples. The processor-based system 1000 may be or include a computer, a server, a programmable logic controller (PLC), the like, or a combination thereof. The processor-based system 1000 may be implemented as the controller 180 or as any other processor-based system to implement any operations described herein. The processor-based system 1000 includes one or more processors 1002, a memory system 1012, a communication bus 1022, one or more input/output (I/O) interfaces 1032, and a network interface 1042.

Each processor 1002 may include one or more processor cores 1004. Each processor 1002 and/or processor core 1004 may be, for example, a hardened processor, such as a central processing unit (CPU), a reduced instruction set computing (RISC) processor, a complex instruction set computing (CISC) processor, a graphics processing unit (GPU), a digital signal processor (DSP), an application specific integrated circuit (ASIC), the like, or a combination thereof, or a soft processor implemented on programmable logic, such as a field programmable gate array (FPGA).

The memory system 1012 includes one or more memory controllers 1014 and memory 1016. The memory controllers 1014 are configured to control read and/or write access to a particular memory 1016 or subset of memory 1016. The memory 1016 may include main memory, disk storage, or any suitable combination thereof. The memory 1016 may include any type of volatile or nonvolatile memory, such as dynamic random access memory (DRAM), static random access memory (SRAM), erasable programmable read-only memory (EPROM), electrically erasable programmable read-only memory (EEPROM), Flash memory, solid-state storage, etc. The memory 1016 is a non-transitory machine-readable storage medium. Instructions 1018 are stored in the memory 1016. The instructions 1018 may be machine-executable code (e.g., machine code) and may comprise firmware, software, a program, an application, or other machine-executable code. The instructions 1018 may, for example, embody a software module 1020, which when executed by the one or more processors 1002, performs various functionality and operations described herein. For example, the instructions 1018 may embody a software module 1020, which when executed by the one or more processors 1002, controls the semiconductor processing tool 100 to perform the etch processes of blocks 206, 210 and the cyclic etch-ash process of block 208 (e.g., including blocks 302, 304), among other things.

The one or more I/O interfaces 1032 are configured to be electrically and/or communicatively coupled to one or more I/O devices 1034. The I/O devices 1034 include the power supplies 126, 136 and the mass flow controllers 160. Other example I/O devices 1034 include a keyboard, a mouse, a display device, a printer, etc. The one or more I/O interfaces 1032 may include connectors or coupling circuitry, such as an industrial application connection, a universal serial bus (USB) connection, a high-definition multimedia interface (HDMI) connection, Bluetooth® circuitry, or the like.

The network interface 1042 is configured to be communicatively coupled to a network 1044. The network interface 1042 may include circuitry for wired communication, such as an Ethernet connection, and/or may include circuitry for wireless communication, such as a circuitry for Wi-Fi® communications. For example, one or more computers and/or servers communicatively coupled to the network 1044 may communicate a recipe, process conditions, or the like to the processor-based system 1000 via the network 1044 and the network interface 1042.

The communication bus 1022 is communicatively connected to the one or more processors 1002, the memory system 1012, the one or more I/O interfaces 1032, and the network interface 1042. The various components can communicate between each other via the communication bus 1022. The communication bus 1022 may control the flow of communications, such as by including an arbiter to arbitrate the communications.

Although various examples have been described in detail, it should be understood that various changes, substitutions, and alterations may be made therein without departing from the scope defined by the appended claims.

What is claimed is:

1. A method of manufacturing an integrated circuit (IC), the method comprising:
    while a semiconductor substrate is disposed within a chamber of a semiconductor processing tool, etching a first opening through a first dielectric layer and stopping on a second dielectric layer while a photoresist is disposed over the first dielectric layer, wherein the first dielectric layer is disposed over the second dielectric layer, and the second dielectric layer is disposed over the semiconductor substrate;
    after etching the first opening and while the semiconductor substrate is within the chamber, removing the photoresist by performing a cyclic etch-ash process that includes at least two cycles, each cycle including generating a first plasma with a fluorine-containing gas, and generating a second fluorine-free plasma that includes oxygen; and
    after performing the cyclic etch-ash process, etching a second opening through the second dielectric layer.

2. The method of claim 1, further comprising:
    depositing a metal material into the first opening and the second opening; and
    removing, by a chemical mechanical polish, excess portions of the metal material from over the first dielectric layer.

3. The method of claim 1, wherein the cyclic etch-ash process is performed with a pressure in the chamber in a range from 10 mtorr to 200 mtorr.

4. The method of claim 1, wherein the cyclic etch-ash process is performed with a pressure in the chamber greater than 50 mtorr.

5. The method of claim 1, wherein the cyclic etch-ash process includes at least three cycles.

6. The method of claim 1, wherein the fluorine-containing gas includes a mixture of a fluorine-containing species and oxygen gas, the fluorine-containing species including one or more of carbon tetrafluoride ($CF_4$) gas, nitrogen trifluoride ($NF_3$) gas, and sulfur hexafluoride ($SF_6$) gas.

7. The method of claim 1, wherein the cyclic etch-ash process includes repeatedly:

flowing a fluorine-containing gas into the chamber; and after flowing the fluorine-containing gas, flowing oxygen gas into the chamber.

8. The method of claim 1, wherein the cyclic etch-ash process includes:

in a first cycle:

flowing a first fluorine-containing gas into the chamber; and after flowing the first fluorine-containing gas, flowing a first oxygen gas into the chamber; and in a second cycle after the first cycle:

flowing a second fluorine-containing gas into the chamber; and after flowing the second fluorine-containing gas, flowing a second oxygen gas into the chamber.

9. The method of claim 1, wherein the cyclic etch-ash process is performed with a power applied to an electrode disposed in the chamber, the power being in a range from about 500 W to about 3 kW.

10. A method of manufacturing an integrated circuit (IC), the method comprising:

forming a photoresist layer on a dielectric layer over a semiconductor substrate;

forming an opening in the photoresist layer, thereby exposing the dielectric layer;

removing a portion of the exposed dielectric layer using a plasma etch process, the removing stopping on an etch stop layer;

removing the photoresist layer, the removing including performing a etch-ash process cycle, the etch-ash process cycle including:

exposing the photoresist layer to a fluorine-based plasma, and then exposing the photoresist layer to an oxygen-based plasma;

repeating the etch-ash process cycle at least once; and after removing the photoresist layer, then removing the etch stop layer.

11. The method of claim 10, wherein the fluorine-based plasma includes a mixture of a fluorine-containing species and oxygen gas.

12. The method of claim 11, wherein the fluorine-containing species includes one or more of carbon tetrafluoride ($CF_4$) gas, nitrogen trifluoride (NF3) gas, and sulfur hexafluoride ($SF_6$) gas.

13. The method of claim 10, wherein:

the photoresist layer is at least 0.5 μm thick after removing the portion of the exposed dielectric layer; and the etch-ash process cycle includes exposing the photoresist layer to the fluorine-based plasma for a first duration, and exposing the photoresist layer to the oxygen-based plasma for a second duration about 4 times the first duration.

14. The method of claim 10, wherein:

the semiconductor substrate is disposed in a chamber of a semiconductor processing tool during the etch-ash process cycle;

during exposing the photoresist layer to the fluorine-based plasma, a pressure in the chamber is in a range from 10 mtorr to 200 mtorr; and during exposing the photoresist layer to the oxygen-based plasma, a pressure in the chamber is in a range from 10 mtorr to 200 mtorr.

15. The method of claim 10, wherein:

the semiconductor substrate is disposed in a chamber of a semiconductor processing tool during the etch-ash process cycle;

during exposing the photoresist layer to the fluorine-based plasma, a pressure in the chamber is greater than 50 mtorr; and during exposing the photoresist layer to the oxygen-based plasma, a pressure in the chamber is greater than 50 mtorr.

16. The method of claim 10, further comprising:

the semiconductor substrate is disposed in a chamber of a semiconductor processing tool during the etch-ash process cycle;

before removing the photoresist layer and while the semiconductor substrate is disposed in the chamber, etching a first opening through a first dielectric layer while the photoresist layer is disposed over the first dielectric layer, the first dielectric layer being disposed over a second dielectric layer, the second dielectric layer being disposed over the semiconductor substrate; and after removing the photoresist layer and while the semiconductor substrate is disposed in the chamber, etching a second opening through the second dielectric layer.

17. The method of claim 10, wherein:

the semiconductor substrate is disposed in a chamber of a semiconductor processing tool during the etch-ash process cycle;

during exposing the photoresist layer to the fluorine-based plasma, a power no greater than 3 KW is applied to an electrode disposed in the chamber; and during exposing the photoresist layer to the oxygen-based plasma, a power no greater than 3 kW is applied to the electrode disposed in the chamber.

18. A method of manufacturing an integrated circuit, the method comprising:

forming a dielectric layer over a semiconductor substrate;

forming a photoresist layer over the dielectric layer;

patterning the photoresist layer thereby exposing the dielectric layer through an opening in the photoresist layer;

etching the exposed dielectric layer thereby forming a trench having an etch stop layer at a trench bottom;

removing the photoresist layer and leaving a remaining portion of the etch stop layer extending between sidewalls of the trench by performing at least two etch-ash cycles, each etch-ash cycle including:

exposing the photoresist layer to a first plasma including a fluorine source species; and then exposing the photoresist layer to a second plasma including oxygen and lacking a fluorine source species;

removing the etch stop layer;

filling the trench with a copper-containing metal and forming a metal overburden over the dielectric layer;

removing the metal overburden by a chemical-mechanical polishing; and removing a portion of the dielectric layer by the chemical-mechanical polishing.

19. The method of claim 1, wherein the first plasma is performed with a first power applied to an electrode disposed in the chamber, and the second plasma is performed with a greater second power applied to the electrode.

20. The method of claim 19, wherein the second power is about 500 W greater than the second plasma.

\* \* \* \* \*